(12) United States Patent
Ko et al.

(10) Patent No.: US 11,870,615 B2
(45) Date of Patent: Jan. 9, 2024

(54) SUMMING CIRCUIT AND EQUALIZER INCLUDING THE SAME

(71) Applicant: Samsung Electronics Co., Ltd., Suwon-si (KR)

(72) Inventors: Kyeongjoon Ko, Yongin-si (KR); Jaehyun Park, Seoul (KR); Junhan Bae, Hwaseong-si (KR); Gyeongseok Song, Hwaseong-si (KR); Jongjae Ryu, Changwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 28 days.

(21) Appl. No.: 17/835,373

(22) Filed: Jun. 8, 2022

(65) Prior Publication Data

US 2022/0400036 A1     Dec. 15, 2022

(30) Foreign Application Priority Data

Jun. 11, 2021   (KR) .................. 10-2021-0076250
Dec. 28, 2021   (KR) .................. 10-2021-0190391

(51) Int. Cl.
*H04L 25/03*      (2006.01)
*H03K 3/037*      (2006.01)
*H03K 19/20*      (2006.01)

(52) U.S. Cl.
CPC ....... *H04L 25/03057* (2013.01); *H03K 3/037* (2013.01); *H03K 19/20* (2013.01)

(58) Field of Classification Search
CPC ......... H04L 25/03006; H04L 25/03019; H04L 25/03057; H04L 25/03146;
(Continued)

(56) References Cited

U.S. PATENT DOCUMENTS 7,436,340 B2   10/2008   Sasaki
8,537,886 B1*   9/2013   Su ................... H04L 25/03038
                                                        375/233
(Continued)

FOREIGN PATENT DOCUMENTS

JP    H08-228154 A    9/1996
JP    4616362 B2      1/2011
(Continued)

*Primary Examiner* — Young T. Tse
(74) *Attorney, Agent, or Firm* — Harness, Dickey & Pierce, P.L.C.

(57) ABSTRACT

Provided are a summing circuit and an equalizer including the summing circuit. The summing circuit includes: a reference signal generator generating a first reference signal and a second reference signal, based on a coefficient code; a first non-overlap clock buffer generating a first switching signal and a second switching signal by using the first reference signal; and a first current source receiving the first switching signal and the second switching signal generated by the first non-overlap clock buffer, generating a first output current by using a bias voltage, and outputting the first output current to an output line, wherein the first switching signal includes a switching signal and a complementary switching signal that is a complementary signal to the switching signal, and wherein a logic low period of the second switching signal is included in a logic high period of the complementary switching signal of the first switching signal.

20 Claims, 12 Drawing Sheets

(58) Field of Classification Search
CPC .... H04L 25/03885; H04L 2025/03433; H03K 3/037; H03K 19/20
USPC ......... 375/232, 233, 346, 350; 708/322, 323
See application file for complete search history.

(56) References Cited

U.S. PATENT DOCUMENTS

| | | |
|---|---|---|
| 8,558,727 B2 | 10/2013 | McGowan |
| 9,231,793 B1 * | 1/2016 | Vareljian ............ H04L 25/03057 |
| 9,806,699 B2 | 10/2017 | Bulzacchelli et al. |
| 10,097,383 B1 | 10/2018 | Bulzacchelli et al. |
| 10,348,534 B1 * | 7/2019 | Sreeramaneni ....... H04L 25/021 |

FOREIGN PATENT DOCUMENTS

| | | |
|---|---|---|
| KR | 10-0139660 B1 | 3/1998 |
| KR | 10-0172414 B1 | 3/1999 |

* cited by examiner

SUMMING CIRCUIT AND EQUALIZER INCLUDING THE SAME

CROSS-REFERENCE TO RELATED APPLICATIONS

This application is based on and claims priority under 35 U.S.C. § 119 to Korean Patent Application No. 10-2021-0076250, filed on Jun. 11, 2021, and Korean Patent Application No. 10-2021-0190391, filed on Dec. 28, 2021, in the Korean Intellectual Property Office, the disclosures of which are incorporated by reference herein in their entirety.

BACKGROUND

The inventive concepts relate to a summing circuit and an equalizer including the summing circuit.

Electronic devices exchange information with other electronic devices by transferring electrical signals to the other electronic devices through channels (for example, signal lines). Signal distortion occurs in signals transmitted and received between electronic devices, due to response characteristics of channels. To compensate for such signal distortion, various types of equalizers have been used.

SUMMARY

The inventive concepts provide a summing circuit including a current summing circuit, which generates a glitch-free output current, and an equalizer including the summing circuit, and further provides an electronic device including the equalizer.

According to an aspect of the inventive concepts, there is provided an equalizer including a summing circuit, wherein the summing circuit includes: a reference signal generator configured to generate a first reference signal and a second reference signal, based on a coefficient code; a first non-overlap clock buffer configured to generate a first switching signal and a second switching signal by using the first reference signal; and a first current source configured to receive the first switching signal and the second switching signal generated by the first non-overlap clock buffer, generate a first output current by using a bias voltage, and output the first output current to an output line, wherein the first switching signal includes a switching signal and a complementary switching signal that is a complementary signal to the switching signal, and wherein a logic low period of the second switching signal is included in a logic high period of the complementary switching signal of the first switching signal.

According to another aspect of the inventive concepts, there is provided an equalizer including a summing circuit, wherein the summing circuit includes: a reference signal generator configured to generate a reference signal, based on a coefficient code; a non-overlap clock buffer configured to generate a first switching signal and a second switching signal by using the reference signal; and a current source including a first switch configured to be switched by the first switching signal, a second switch configured to be switched by the second switching signal, and a current cell configured to generate an output current, and wherein at least one of the first switch and the second switch is in an off-state.

According to yet another aspect of the inventive concepts, there is provided a summing circuit including a current summing circuit, wherein the current summing circuit includes: a reference signal generator configured to generate a plurality of reference signals, based on a coefficient code; a plurality of non-overlap clock buffers configured to generate a plurality of first switching signals and a plurality of second switching signals by using the plurality of reference signals, respectively; and a plurality of current sources each including a first switch, a second switch, and a current cell, and wherein at least one of the first switch and the second switch of each of the plurality of current sources is in an off-state.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EXAMPLE EMBODIMENTS

Hereinafter, various example embodiments of the inventive concepts will be described with reference to the accompanying drawings.

Figure 1:
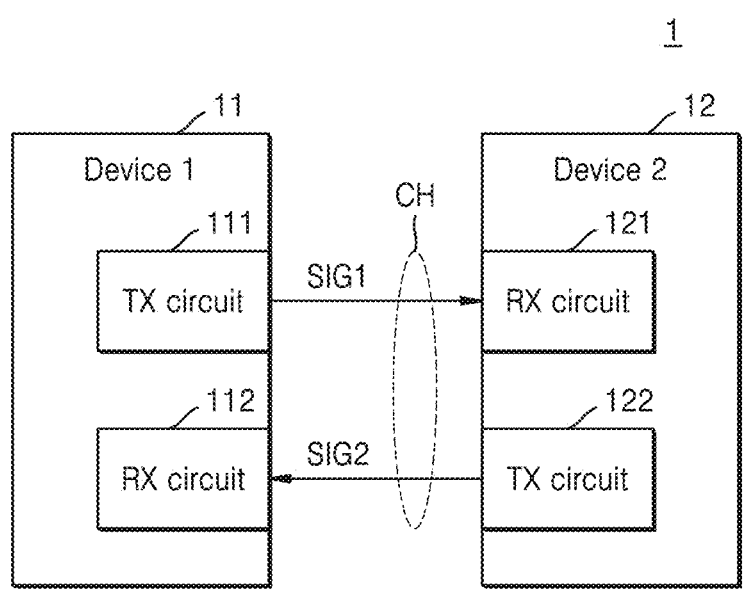
FIG. 1 is a block diagram illustrating a summing circuit according to example embodiments of the inventive concepts.

FIG. 1 is a block diagram illustrating an electronic system according to the inventive concepts as an example.

Referring to FIG. 1, an electronic system 1 may include a first device 11 and/or a second device 12. In example embodiments, each of the first device 11 and the second device 12 may include a portable communication terminal, a personal digital assistant (PDA), a portable media player (PMP), a smartphone, a wearable device, or a computing device, such as a personal computer, a server, a workstation, or a notebook computer. Alternatively, each of the first device 11 and the second device 12 may include various hardware components, for example, a processor, a memory device, a storage device, or a controller, included in one user device.

The first device 11 and the second device 12 may exchange signals SIG1 and SIG2 with each other through a channel CH. For example, the first device 11 may include a first transmission circuit 111. The first transmission circuit 111 may transmit information generated by the first device 11, as the first signal SIG1, to the second device 12 through the channel CH. The second device 12 may include a first reception circuit 121. The first reception circuit 121 may receive the first signal SIG1 transmitted from the first transmission circuit 111, through the channel CH.

Alternatively, the second device 12 may include a second transmission circuit 122, and the first device 11 may include a second reception circuit 112. The second transmission circuit 122 may transmit the second signal SIG2 to the first device 11 through the channel CH, and the second reception circuit 112 may receive the second signal SIG2 through the channel CH.

In example embodiments, the channel CH may be a signal line (that is, a wired communication channel) electrically connecting the first device 11 to the second device 12, or be a wireless communication channel. That is, each of the first transmission circuit 111, the second transmission circuit 122, the first reception circuit 121, and the second reception circuit 112 may transmit and receive various signals such as an electrical signal, an optical signal, a wireless signal, and the like. Hereinafter, for convenience of description, it is assumed that each of the first transmission circuit 111, the second transmission circuit 122, the first reception circuit 121, and the second reception circuit 112 operates based on an electrical signal.

In example embodiments, although the first transmission circuit 111 and the second reception circuit 112 are shown separately from each other in the first device 11, and the first reception circuit 121 and the second transmission circuit 122 are shown separately from each other in the second device 12, the inventive concepts are not limited thereto. The first transmission circuit 111 and the second reception circuit 112 may be implemented as one circuit, and the first reception circuit 121 and the second transmission circuit 122 may be implemented as one circuit.

In example embodiments, the first signal SIG1 may be distorted due to noise caused by response characteristics of the channel CH or external factors while passing through the channel CH. In some example embodiments, information transmitted by the first transmission circuit 111 may be different from information received by the first reception circuit 121, and thus, an error or a misoperation may occur in the second device 12.

To reduce or prevent such an error or misoperation, the first transmission circuit 111 or the first reception circuit 121 may include components for compensating for signal distortion caused by noise. In example embodiments, the first transmission circuit 111 may include a transmission equalizer configured to compensate for signal distortion due to the response characteristics of the channel CH, and the first reception circuit 121 may include a reception equalizer configured to compensate for signal distortion of the first signal SIG1 due to the response characteristics of the channel CH. The first reception circuit 121 may further include a sequence estimator configured to estimate data (or a symbol or a sequence) based on the received first signal SIG1.

Configurations and operations of the first transmission circuit 111 and the first reception circuit 121, which are described above, will be described in more detail with reference to the following figures. Hereinafter, for convenience of description, although example embodiments will be described based on the first transmission circuit 111 of the first device 11 and the first reception circuit 121 of the second device 12, the same descriptions may also be applied to the second transmission circuit 122 and the second reception circuit 112.

Figure 2:
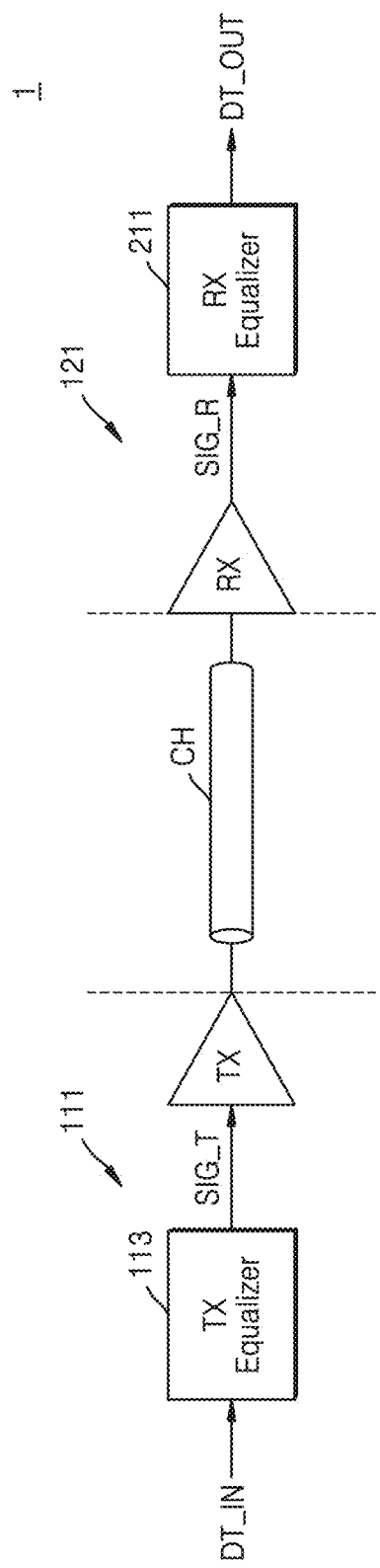
FIG. 2 is a block diagram specifically illustrating a first transmission circuit and a first reception circuit of FIG. 1.

FIG. 2 is a block diagram specifically illustrating the first transmission circuit and the first reception circuit of FIG. 1. Hereinafter, for convenience of description, to represent signals generated/transmitted/received between components, terms such as "signal", "data", "symbol", "bit", and the like are used. Such terms are for concisely describing example embodiments of the inventive concepts, and each term should be understood organically in conjunction with a function of each component.

In addition, a transmission equalizer 113 or a reception equalizer 211, according to the inventive concepts, may be a decision feedback equalizer. However, the scope of the inventive concepts are not limited thereto, and each of the transmission equalizer 113 and the reception equalizer 211 may be implemented by one of various types of signal compensation circuits, and, for example, the transmission equalizer 113 may be implemented by a feed-forward equalizer.

Referring to FIG. 2, the first transmission circuit 111 may include the transmission equalizer 113 and/or a transmission driver TX. The transmission equalizer 113 may receive input data DT_IN and may output a transmission data signal SIG_T based on the received input data DT_IN. The transmission driver TX may transmit the transmission data signal SIG_T to the first reception circuit 121 of the second device 12 through the channel CH.

To remove inter-symbol interference occurring between the input data DT_IN, the transmission equalizer 113 may generate the transmission data signal SIG_T by reflecting a predetermined or alternatively, desired coefficient in a previous symbol, a current symbol, and a subsequent symbol of the input data DT_IN. In example embodiments, the symbol may indicate 1-bit or more data having a specific logical value, and the inter-symbol interference may occur because a specific symbol of the input data DT_IN interferes with another symbol and is distorted. The inter-symbol interference may be more prominent as a data transfer rate increases and a pulse width representing a data bit becomes narrower in correspondence therewith.

For example, when first to third symbols are sequentially transmitted in the stated order through the channel CH, due to the response characteristics of the channel CH, a signal corresponding to the first symbol may affect the second symbol and the third symbol, a signal corresponding to the second symbol may affect the first symbol and the third symbol, and a signal corresponding to the third symbol may affect the first symbol and the second symbol. The transmission equalizer 113 may generate the transmission data signal SIG_T by compensating for a component of each of the first to third symbols, which affects the other symbols.

The first reception circuit 121 may include a reception driver RX and the reception equalizer 211. The reception driver RX may receive the transmission data signal SIG_T, which is transmitted from the first transmission circuit 111 through the channel CH, and output a reception data signal SIG_R. As the transmission data signal SIG_T passes through the channel CH, the transmission data signal SIG_T may be distorted due to noise. That is, the reception driver RX may receive the transmission data signal SIG_T, which is distorted by noise, and output the reception data signal SIG_R.

The reception equalizer 211 may output output data DT_OUT, based on the reception data signal SIG_R. The reception equalizer 211 may output the output data DT_OUT by removing the inter-symbol interference. For example, the reception equalizer 211 may be a decision feedback equalizer.

To remove the inter-symbol interference from the reception data signal SIG_R, the reception equalizer 211 may output the output data DT_OUT by reflecting a predetermined or alternatively, desired coefficient in a previous symbol, a current symbol, and a subsequent symbol of the reception data signal SIG_R. In example embodiments, an operating principle of the reception equalizer 211 may be similar to an operating principle of the transmission equalizer 113.

The reception equalizer 211 may be an equalizer having a 1-tap structure. That is, the reception equalizer 211 may cancel out the inter-symbol interference with respect to a symbol before 1 period. Alternatively, the reception equalizer 211 may be expanded to an n-tap structure (where n is a natural number of 1 or more).

In example embodiments, the reception equalizer 211 may include a summing circuit. The summing circuit may remove signal distortion according to the inter-symbol interference of the reception data signal SIG_R by weighted-summing the reception data signal SIG_R and a feedback signal. The summing circuit may include a current summing circuit (for example, 10 of FIG. 4) configured to generate an output current according to a coefficient code. The summing circuit may remove the signal distortion of the reception data signal SIG_R by using the output current generated by the current summing circuit.

The current summing circuit may include a plurality of current sources, each configured to generate an output current by using a bias voltage, according to a plurality of switching signals. Here, the plurality of switching signals are generated such that a plurality of switches respectively included in the plurality of current sources are not in an on-state simultaneously, whereby a glitch occurring in the output current may be removed. That is, the switching signals may be generated such that at least one of the plurality of switches is in an off-state. A specific configuration of the current summing circuit will be described below with reference to FIG. 4 and the like.

Figure 3:
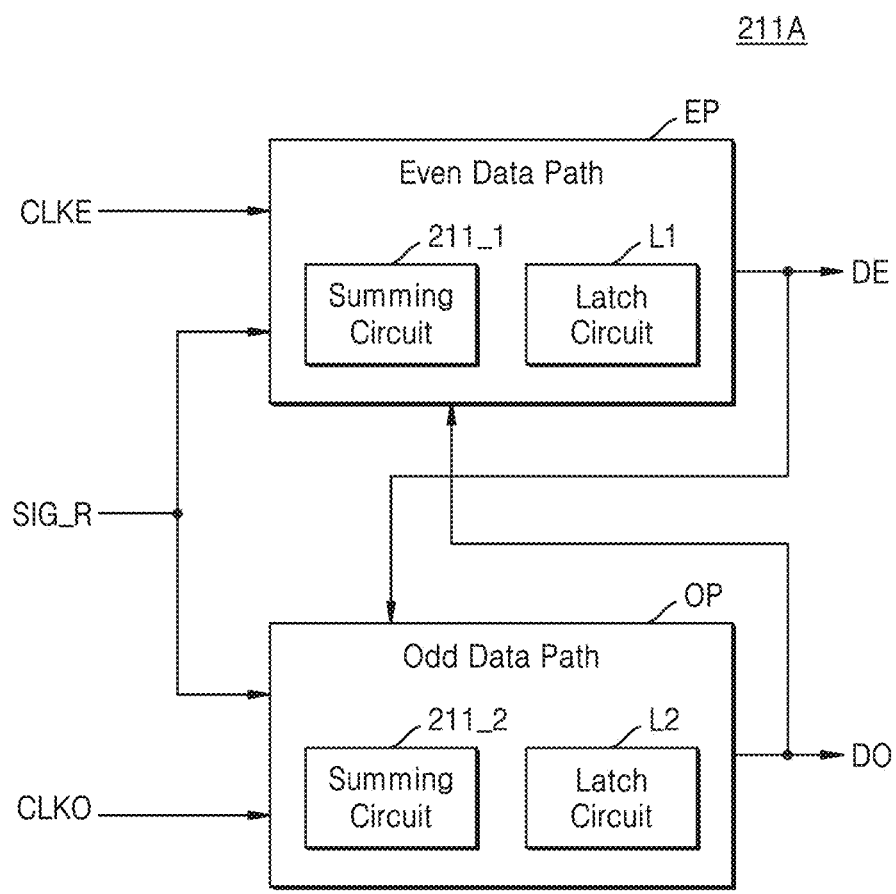
FIG. 3 is a block diagram illustrating an equalizer according to the inventive concepts.

FIG. 3 is a block diagram illustrating an equalizer according to the inventive concepts. An equalizer 211A described with reference to FIG. 3 may be an example of the first reception equalizer 211 of FIG. 2.

Referring to FIG. 3, the equalizer 211A may include an even data path EP and an odd data path OP. The equalizer 211A may output the reception data signal SIG_R to be divided into parallel data streams, for example, an even data signal DE and an odd data signal DO.

The even data path EP may receive the reception data signal SIG_R and generate the even data signal DE, and the odd data path OP may receive the reception data signal SIG_R and generate the odd data signal DO. The odd data signal DO is input to the even data path EP, and the even data signal DE is input to the odd data path OP, whereby the equalizer 211A may include a feedback circuit structure.

The even data path EP may include a first summing circuit 211_1 and a first latch circuit L1, and the odd data path OP may include a second summing circuit 211_2 and a second latch circuit L2. The odd data signal DO may be input to the first summing circuit 211_1 of the even data path EP, and the even data signal DE may be input to the second summing circuit 211_2 of the odd data path OP. In example embodiments, each of the first latch circuit L1 and the second latch circuit L2 may include a latch unit configured to, according to a clock signal, latch an input signal and generate a latch signal, and a multiplexer configured to, according to a clock signal, output at least one of the input signal and the latch signal as an output signal.

The first summing circuit 211_1 may weighted-sum a signal obtained by amplifying the reception data signal SIG_R, and the odd data signal DO received from the odd data path OP. For example, the first summing circuit 211_1 may apply a weight to the odd data signal DO and add up the weight-applied odd data signal DO to the signal obtained by amplifying the reception data signal SIG_R.

The second summing circuit 211_2 may weighted-sum the signal obtained by amplifying the reception data signal SIG_R, and the even data signal DE received from the even data path EP. For example, the second summing circuit 211_2 may apply a weight to the even data signal DE and add up the weight-applied even data signal DE to the signal obtained by amplifying the reception data signal SIG_R.

Each of the first summing circuit 211_1 and the second summing circuit 211_2 may include a current summing circuit configured to generate an output current according to a coefficient code. The current summing circuit may include a plurality of current sources, each configured to generate an output current by using a bias voltage, according to a plurality of switching signals. Here, the plurality of switching signals are generated such that a plurality of switches respectively included in the plurality of current sources are not in the on-state simultaneously, whereby a glitch may not occur in the output current.

Figure 4:
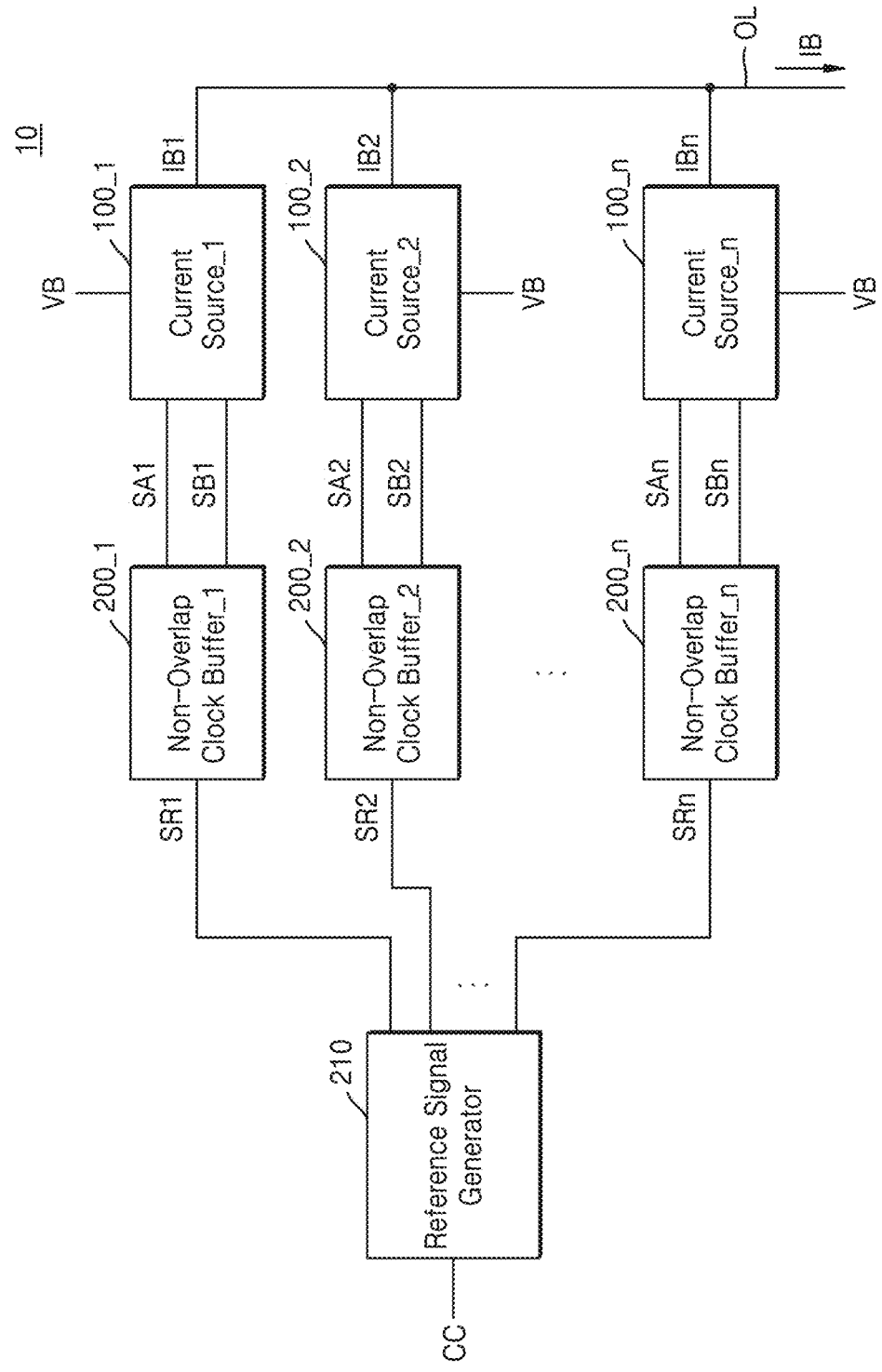
FIG. 4 is a block diagram illustrating a summing circuit according to example embodiments of the inventive concepts.
Figure 5:
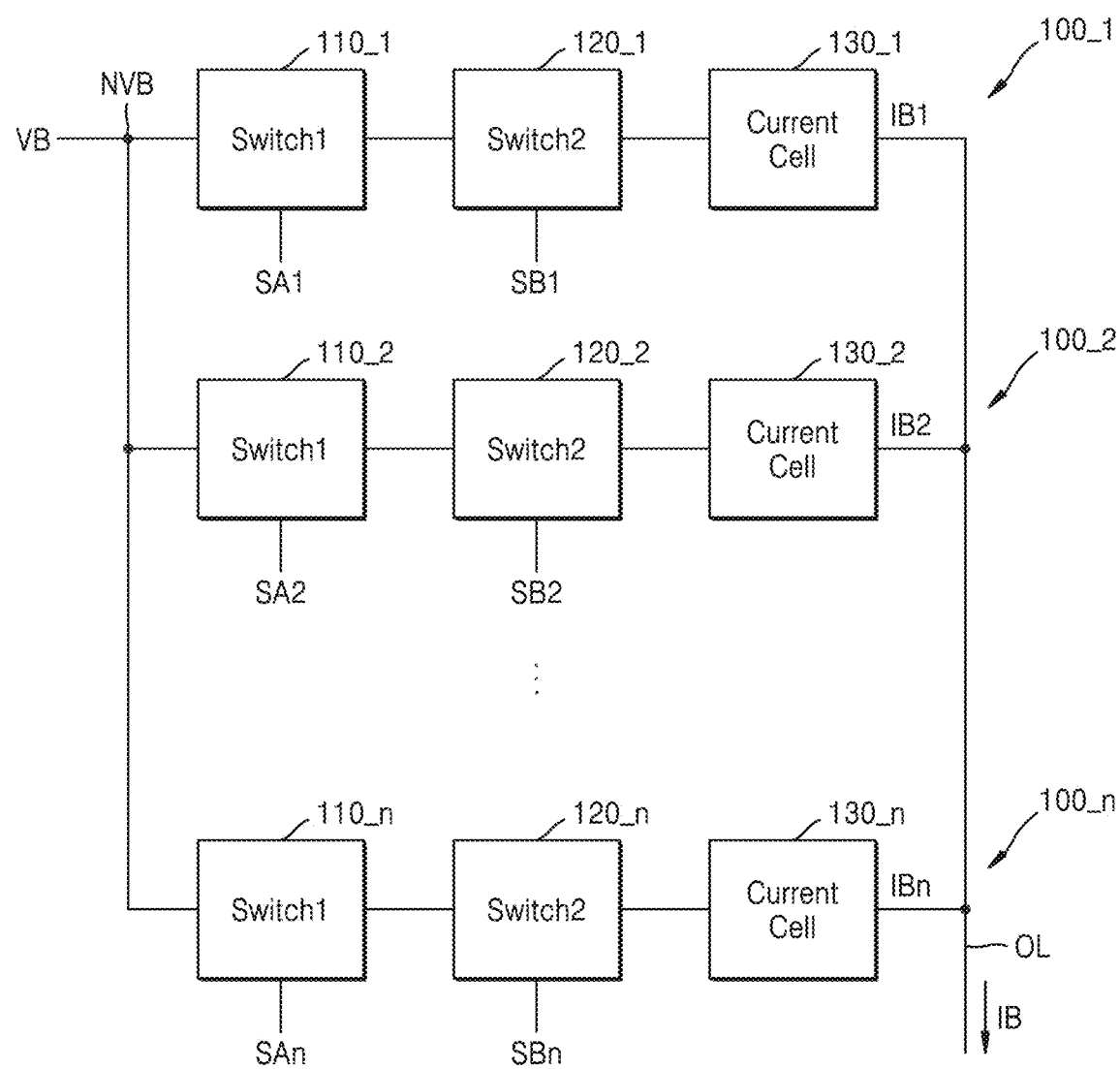
FIG. 5 is a block diagram illustrating a plurality of current sources included in a summing circuit, according to example embodiments of the inventive concepts.

FIG. 4 is a block diagram illustrating a summing circuit according to example embodiments of the inventive concepts. FIG. 5 is a block diagram illustrating a plurality of current sources included in a summing circuit, according to example embodiment of the inventive concepts.

Referring to FIG. 4, the summing circuit may include a current summing circuit 10. For example, the current summing circuit 10 may be included in the summing circuit described with reference to FIGS. 2 and 3.

The current summing circuit 10 may receive a coefficient code CC and generate an output current IB according to the coefficient code CC. The current summing circuit 10 may include a reference signal generator 210, first to n-th non-overlap clock buffers 200_1 to 200_$n$, and/or first to n-th current sources 100_1 to 100_$n$. For example, n may be a natural number of 2 or more. The first to n-th non-overlap clock buffers 200_1 to 200_$n$ may respectively correspond to the first to n-th current sources 100_1 to 100_$n$.

The reference signal generator 210 may generate first to n-th reference signals SR1 to SRn by using the coefficient code CC. Each of the first to n-th reference signals SR1 to SRn may be provided to a corresponding non-overlap clock buffer from among the first to n-th non-overlap clock buffers 200_1 to 200_$n$. In example embodiments, the coefficient code CC may be an n-bit signal, and 1 bit out of the n bits may each correspond to one of the first to n-th reference signals SR1 to SRn.

The first non-overlap clock buffer 200_1 may generate a first switching signal SA1 and a second switching signal SB1 by receiving the first reference signal SR1 and may provide the first switching signal SA1 and the second switching signal SB1 to the first current source 100_1. The second non-overlap clock buffer 200_2 may generate a first switching signal SA2 and a second switching signal SB2 by receiving the second reference signal SR2 and may provide the first switching signal SA2 and the second switching signal SB2 to the second current source 100_2. The n-th non-overlap clock buffer 200_n may generate a first switching signal SAn and a second switching signal SBn by receiving the n-th reference signal SRn and may provide the first switching signal SAn and the second switching signal SBn to the n-th current source 100_n.

In example embodiments, the first non-overlap clock buffer 200_1 may generate the first switching signal SA1 and the second switching signal SB1 such that a plurality of switches included in the first current source 100_1 are not in the on-state simultaneously. In addition, the second non-overlap clock buffer 200_2 may generate the first switching signal SA2 and the second switching signal SB2 such that a plurality of switches included in the second current source 100_2 are not in the on-state simultaneously, and the n-th non-overlap clock buffer 200_n may generate the first switching signal SAn and the second switching signal SBn such that a plurality of switches included in the n-th current source 100_n are not in the on-state simultaneously.

The first to n-th current sources 100_1 to 100_n may generate first to n-th output currents IB1 to Ibn, respectively, by using a bias voltage VB and respectively output the first to n-th output currents IB1 to Ibn, respectively, to an output line OL. The first current source 100_1 may generate or may not generate the first output current IB1 by using the bias voltage VB, according to the first switching signal SA1 and the second switching signal SB1. The second current source 100_2 may generate or may not generate the second output current IB2 by using the bias voltage VB, according to the first switching signal SA2 and the second switching signal SB2. The n-th current source 100_n may generate or may not generate the n-th output current IBn by using the bias voltage VB, according to the first switching signal SAn and the second switching signal SBn. The first to n-th output currents IB1 to IBn respectively generated by the first to n-th current sources 100_1 to 100_n may be output as an output current IB through the output line OL. Accordingly, a magnitude of the output current IB may vary according to the coefficient code CC.

Referring to FIGS. 4 and 5, the first current source 100_1 may include a first switch 110_1, a second switch 120_1, and/or a current cell 130_1. The first switch 110_1 of the first current source 100_1 may be switched by the first switching signal SA1, and the second switch 120_1 of the first current source 100_1 may be switched by the second switching signal SB1. According to switching operations of the first switch 110_1 and the second switch 120_1, the bias voltage VB may be provided to the current cell 130_1 of the first current source 100_1, and the current cell 130_1 may generate the first output current IB1.

The second current source 100_2 may include a first switch 110_2, a second switch 120_2, and/or a current cell 130_2, and the n-th current source 100_n may include a first switch 110_n, a second switch 120_n, and/or a current cell 130_n. The first switch 110_2 of the second current source 100_2 may be switched by the first switching signal SA2, and the second switch 120_2 of the second current source 100_2 may be switched by the second switching signal SB2. According to switching operations of the first switch 110_2 and the second switch 120_2 of the second current source 100_2, the bias voltage VB may be provided to the current cell 130_2 of the second current source 100_2, and the current cell 130_2 may generate the second output current IB2. In addition, the first switch 110_n of the n-th current source 100_n may be switched by the first switching signal SAn, and the second switch 120_n of the n-th current source 100_n may be switched by the second switching signal SBn. According to switching operations of the first switch 110_n and the second switch 120_n of the n-th current source 100_n, the bias voltage VB may be provided to the current cell 130_n of the n-th current source 100_n, and the current cell 130_n may generate the n-th output current IBn.

In example embodiments, the first switch 110_1 may be a bias switch controlling to provide the bias voltage VB to the current cell 130_1, and the second switch 120_1 may be a pull-up switch. Accordingly, when the first switch 110_1 is turned off, the second switch 120_1 may be turned on, and when the second switch 120_1 is turned off, the first switch 110_1 may be turned on. That is, the first switch 110_1 and the second switch 120_1 may not be in the on-state simultaneously, and at least one of the first switch 110_1 and the second switch 120_1 may be in the off-state. Likewise, the first switch 110_2 and the second switch 120_2 of the second current source 100_2 may not be turned on simultaneously, and the first switch 110_n and the second switch 120_n of the n-th current source 100_n may not be turned on simultaneously.

Because the first switch 110_1 and the second switch 120_1 of the first current source 100_1 are not in the on-state simultaneously, because the first switch 110_2 and the second switch 120_2 of the second current source 100_2 are not in the on-state simultaneously, and because the first switch 110_n and the second switch 120_n of the n-th current source 100_n are not in the on-state simultaneously, a bias voltage node NVB, to which the bias voltage VB is applied, may be stable. Accordingly, a glitch occurring in each of the first to n-th output currents IB1 to IBn may be removed, and a glitch occurring in the output current IB may be removed.

Figure 6:
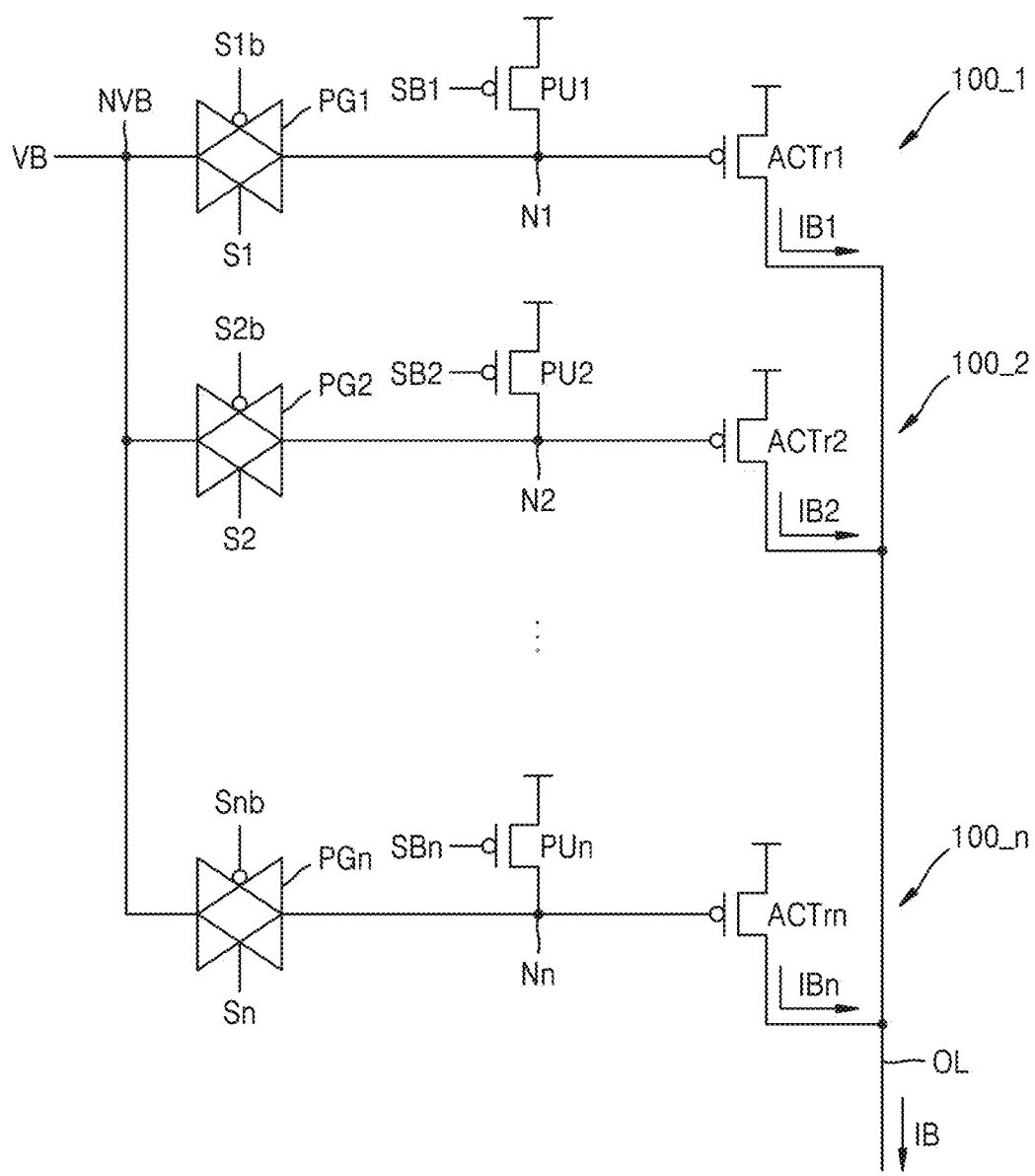
FIG. 6 is a block diagram illustrating a plurality of current sources included in a summing circuit, according to example embodiments of the inventive concepts.

FIG. 6 is a block diagram illustrating a plurality of current sources included in a summing circuit, according to example embodiments of the inventive concepts. The first to n-th current sources 100_1 to 100_n of FIG. 6 respectively are examples of the first to n-th current sources 100_1 to 100_n of FIG. 5.

Referring to FIGS. 5 and 6, the first switch 110_1 of the first current source 100_1 may be implemented by a transmission gate PG1. The transmission gate PG1 may be a CMOS-based switch including a P-type transistor and an N-type transistor. The first switching signal SA1 may include a switching signal S1 and a complementary switching signal S1b, and the transmission gate PG1 may be switched by the switching signal S1 and the complementary switching signal S1b. The complementary switching signal S1b is a complementary signal to the switching signal S1, and the switching signal S1 and the complementary switching signal S1b may have phases opposite to each other.

The second switch 120_1 of the first current source 100_1 may be implemented by a P-type transistor PU1 connected between a first node N1 and a power supply voltage terminal. The second switching signal SB1 may be input to a gate terminal of the P-type transistor PU1.

The current cell 130_1 of the first current source 100_1 may be implemented by a P-type transistor ACTr1 connected between the output line OL and the power supply voltage terminal. A gate terminal of the P-type transistor ACTr1 may be connected to the first node N1.

When the P-type transistor PU1, which is the second switch 120_1, is turned off and the transmission gate, which is PG1 the first switch 110_1, is turned on, the bias voltage VB may be applied to the gate terminal of the P-type transistor ACTr1, which is the current cell 130_1, and the P-type transistor ACTr1 may generate the first output current IB1. On the other hand, when the transmission gate PG1, which is the first switch 110_1, is turned off and the P-type transistor PU1, which is the second switch 120_1, is turned on, a power supply voltage may be applied to the gate terminal of the P-type transistor ACTr1, which is the current cell 130_1. The P-type transistor ACTr1 may be turned off, and the first output current IB1 may not be generated.

The transmission gate PG1 and the P-type transistor PU1 of the first current source 100_1 according to the inventive concepts may be controlled not to be turned on simultaneously. That is, at least one of the transmission gate PG1 and the P-type transistor PU1 may be turned off. Accordingly, the bias voltage node NVB may be reduced or prevented from being connected to the power supply voltage terminal because the transmission gate PG1 and the P-type transistor PU1 are simultaneously turned on, and the bias voltage node NVB, to which the bias voltage VB is applied, may be stable.

The first switch 110_2 of the second current source 100_2 may be implemented by a transmission gate PG2 and may be switched by a switching signal S2 and a complementary switching signal S2b. The first switching signal SA2 may include the switching signal S2 and the complementary switching signal S2b, and the complementary switching signal S2b may be a complementary signal to the switching signal S2.

The second switch 120_2 of the second current source 100_2 may be implemented by a P-type transistor PU2 connected between a second node N2 and the power supply voltage terminal. The second switching signal SB2 may be input to a gate terminal of the P-type transistor PU2.

The current cell 130_2 of the second current source 100_2 may be implemented by a P-type transistor ACTr2 connected between the output line OL and the power supply voltage terminal. A gate terminal of the P-type transistor ACTr2 may be connected to the second node N2. The P-type transistor ACTr2 may generate the second output current IB2 according to a voltage of the second node N2. For example, when the transmission gate PG2 is turned on, the P-type transistor ACTr2 may generate the second output current IB2, and when the P-type transistor PU2 is turned on, the P-type transistor ACTr2 may not generate the second output current IB2.

The first switch 110_n of the n-th current source 100_n may be implemented by a transmission gate PGn and may be switched by a switching signal Sn and a complementary switching signal Snb. The first switching signal SAn may include the switching signal Sn and the complementary switching signal Snb, and the complementary switching signal Snb may be a complementary signal to the switching signal Sn.

The second switch 120_n of the n-th current source 100_n may be implemented by a P-type transistor PUn connected between an n-th node Nn and the power supply voltage terminal. The second switching signal SBn may be input to a gate terminal of the P-type transistor PUn.

The current cell 130_n of the n-th current source 100_n may be implemented by a P-type transistor ACTrn connected between the output line OL and the power supply voltage terminal. A gate terminal of the P-type transistor ACTrn may be connected to the n-th node Nn. The P-type transistor ACTrn may generate the n-th output current IBn according to a voltage of the n-th node Nn. For example, when the transmission gate PGn is turned on, the P-type transistor ACTrn may generate the n-th output current IBn, and when the P-type transistor PUn is turned on, the P-type transistor ACTrn may not generate the n-th output current IBn. As the number of current sources generating output currents, from among the first to n-th current sources 100_1 to 100_n, increases, the output current IB that is output through the output line OL may increase.

Figure 7:
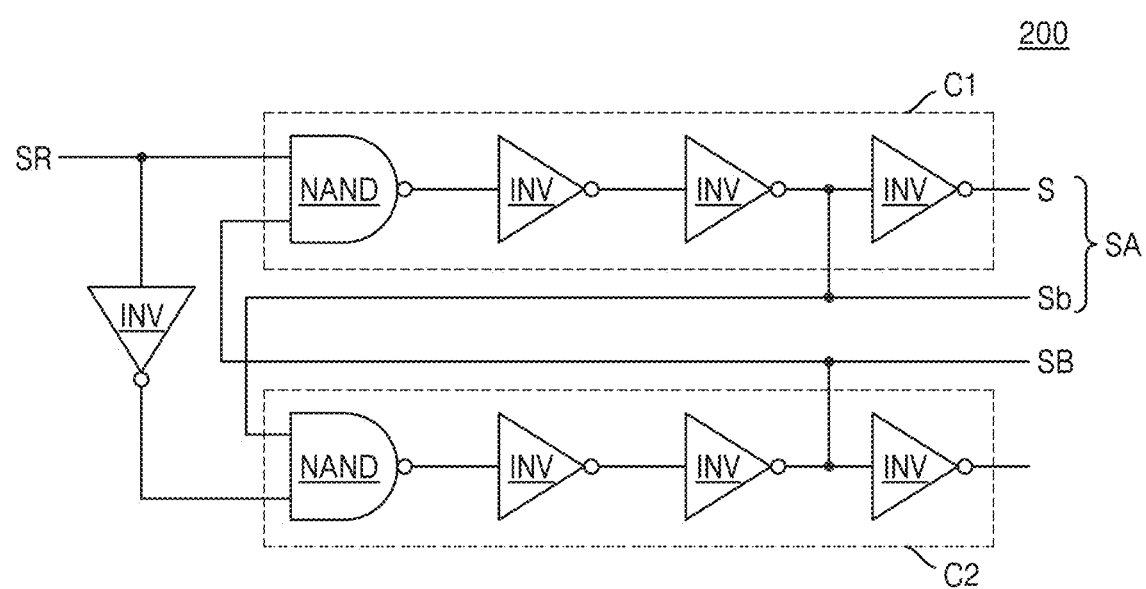
FIG. 7 is a block diagram illustrating a non-overlap clock buffer included in a summing circuit, according to example embodiments of the inventive concepts.
Figure 8A:
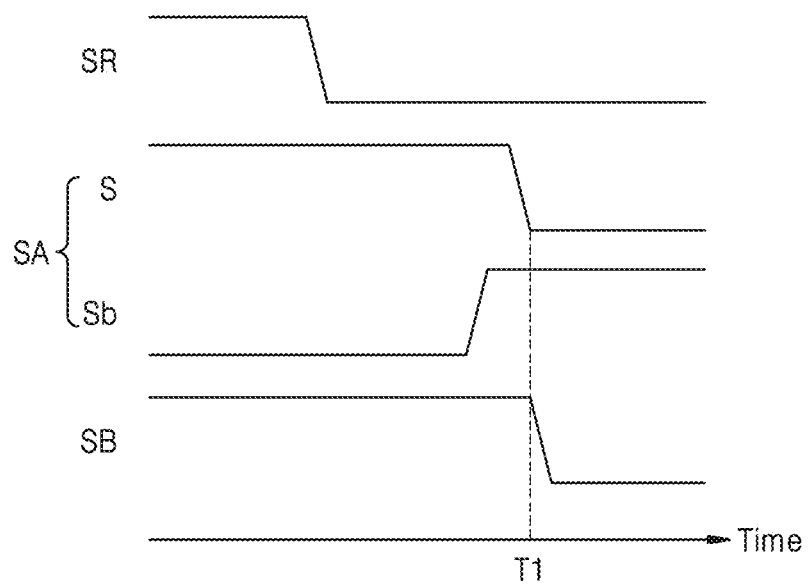
FIGS. 8A and 8B are timing diagrams each illustrating switching signals generated by a non-overlap clock buffer included in a summing circuit, according to example embodiments of the inventive concepts.
Figure 8B:
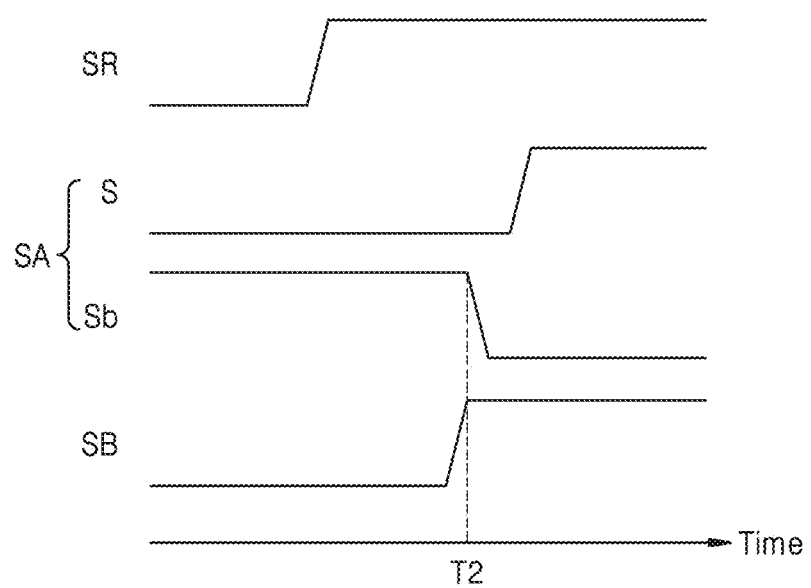

FIG. 7 is a block diagram illustrating a non-overlap clock buffer included in a summing circuit, according to example embodiments of the inventive concepts. FIGS. 8A and 8B are timing diagrams each illustrating switching signals generated by a non-overlap clock buffer included in a summing circuit, according to example embodiments of the inventive concepts. Descriptions of a non-overlap clock buffer 200, which are given with reference to FIG. 7, may be applied to each of the first to n-th non-overlap clock buffers 200_1 to 200_n of FIG. 4. Descriptions of a first switching signal SA and a second switching signal SB, which are given with reference to FIG. 8, may be respectively applied to the first switching signals SA1 to SAn and the second switching signals SB1 to SBn, which are described with reference to FIGS. 5 and 6.

Referring to FIG. 7, the non-overlap clock buffer 200 may include a plurality of inverters INV and a plurality of NAND gates NAND. Some inverters INV of the non-overlap clock buffer 200 may be connected to each other in series and thus have a buffer chain structure, and some other inverters INV may be connected to each other in series and thus have a buffer chain structure.

The non-overlap clock buffer 200 may receive a reference signal SR and generate the first switching signal SA and the second switching signal SB. The non-overlap clock buffer 200 may include a first circuit C1 generating the first switching signal SA, and a second circuit C2 generating the second switching signal SB. The first switching signal SA may include a switching signal S and a complementary switching signal Sb that is a complementary signal to the switching signal S.

In example embodiments, each of the first circuit C1 and the second circuit C2 may include one NAND gate NAND and the plurality of inverters INV, which are sequentially connected to each other in series. For example, the reference signal SR and the second switching signal SB may be input to the NAND gate NAND of the first circuit C1. A signal output from the NAND gate NAND of the first circuit C1 may pass through an odd number (for example, three) of inverters INV to output the switching signal S, and the signal output from the NAND gate NAND of the first circuit C1 may pass through an even number (for example, two) of inverters INV to output the complementary switching signal Sb. The complementary switching signal Sb may be a signal output from an inverter INV, to which the switching signal S is input, and may be a signal into which the switching signal S is inverted.

For example, an inverted reference signal, in which the reference signal SR is inverted by the inverter INV, and the complementary switching signal Sb of the first switching signal SA may be input to the NAND gate NAND of the second circuit C2. A signal output from the NAND gate NAND of the second circuit C2 may pass through an even number (for example, two) of inverters INV to output the second switching signal SB.

Referring to FIGS. 7, 8A, and 8B, when a level of the reference signal SR is changed from logic high to logic low, a level of the switching signal S of the first switching signal SA may be changed from logic high to logic low after a certain delay time, a level of the complementary switching signal Sb of the first switching signal SA may be changed from logic low to logic high after a certain delay time, and a level of the second switching signal SB may be changed from logic high to logic low after a certain delay time. Here, at a first time point T1, which is a time point after the level of the switching signal S of the first switching signal SA is changed from logic high to logic low and the level of the complementary switching signal Sb of the first switching signal SA is changed from logic low to logic high, the level of the second switching signal SB may be changed from logic high to logic low. Accordingly, after a first switch (bias switch) included in a current source is turned off, a second switch (pull-up switch) may be turned on.

When the level of the reference signal SR is changed from logic low to logic high, the level of the switching signal S of the first switching signal SA may be changed from logic low to logic high after a certain delay time, the level of the complementary switching signal Sb of the first switching signal SA may be changed from logic high to logic low after a certain delay time, and the level of the second switching signal SB may be changed from logic low to logic high after a certain delay time. Here, at a second time point T2, which is a time point after the level of the second switching signal SB is changed from logic low to logic high, the level of the switching signal S of the first switching signal SA may be changed from logic low to logic high, and the level of the complementary switching signal Sb of the first switching signal SA may be changed from logic high to logic low. Accordingly, after the first switch (pull-up switch) included in the current source is turned off, the first switch (bias switch) may be turned on.

That is, a period during which the second switching signal SB maintains being logic low may be included in a period during which the complementary switching signal Sb of the first switching signal SA maintains being logic high, and the period during which the second switching signal SB maintains being logic low may be included in a period during which the switching signal S of the first switching signal SA maintains being logic low. That is, a period during which the second switch (pull-up switch) is in the on-state may be included in a period during which the first switch (bias switch) is in the off-state, and a period during which the first switch (bias switch) is in the on-state may be included in a period during which the second switch (pull-up switch) is in the off-state. In addition, a period during which the complementary switching signal Sb of the first switching signal SA maintains being logic low may be included in a period during which the second switching signal SB maintains being logic high, and a period during which the switching signal S of the first switching signal SA maintains being logic high may be included in the period during which the second switching signal SB maintains being logic high.

A first switch and a second switch both included in a current source (for example, a corresponding current source from among the first to n-th current sources 100_1 to 100_n in FIGS. 5 and 6), to which the non-overlap clock buffer 200 provides the first switching signal SA and the second switching signal SB, may not be in the on-state simultaneously, and at least one of the first switch and the second switch may be maintained in the off-state. Accordingly, a glitch occurring in an output current generated by the current source may be removed.

Figure 9:
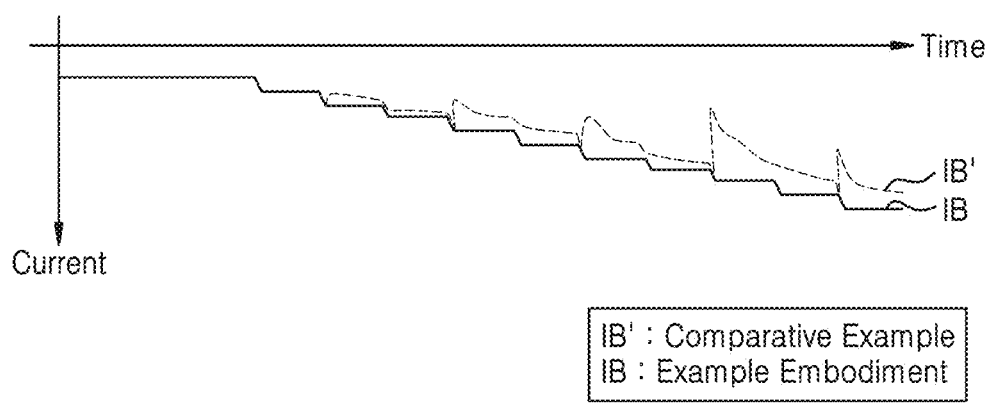
FIG. 9 is a diagram provided for comparing an output current, which is generated by a current summing circuit according to example embodiments of the inventive concepts, with an output current according to a comparison example.

FIG. 9 is a diagram provided for comparing an output current, which is generated by a current summing circuit according to example embodiments of the inventive concepts, with an output current according to a comparison example. FIG. 9 illustrates output currents IB and IB' generated as the coefficient code CC changes over time.

Referring to FIG. 9, unlike the current summing circuit according to the inventive concepts, a signal (for example, the switching signal S in FIGS. 8A and 8B), which is the same as a portion of a first switching signal, is input as a second switching signal to a current summing circuit according to the comparison example. Accordingly, in the current summing circuit according to the comparison example, both a first switch and a second switch may be temporarily in the on-state in a period during which a level of the first switching signal is changed from logic low to logic high or in a period during which the level of the first switching signal is changed from logic high to logic low. Therefore, a bias voltage node, to which a bias voltage provided to the current summing circuit according to the comparison example is applied, may be temporarily connected to a power supply voltage node and be unstable. A glitch occurs in the output current IB' generated by the current summing circuit according to the comparison example.

On the other hand, as described above with reference to FIG. 5 and the like, in the current summing circuit according to the inventive concepts, a second switching signal (corresponding to one of SB1 to SBn) is provided to reduce or prevent a first switch (corresponding to one of 100_1 to 100_n) and a second switch (corresponding to one of 120_1 to 120_n) from being in the on-state simultaneously, whereby the bias voltage node NVB, to which the bias voltage VB is applied, may be stable and a glitch in the output current IB may be reduced or prevented from occurring.

Figure 10:
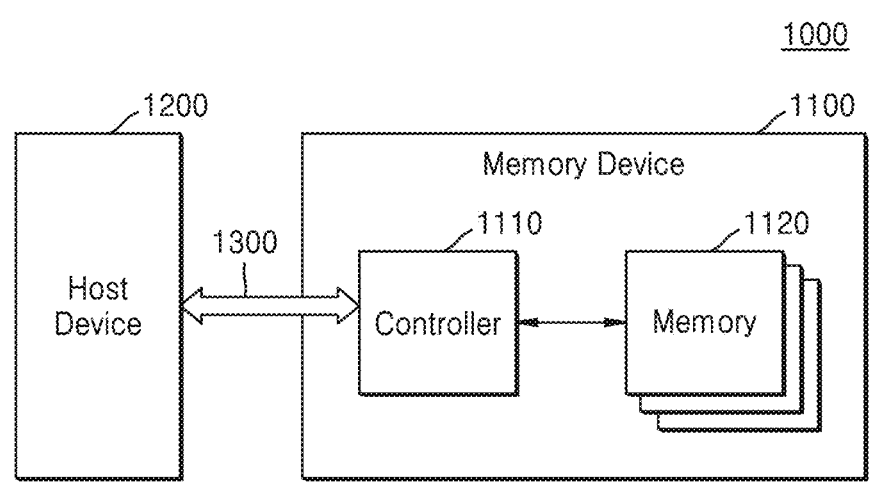
FIG. 10 is a diagram illustrating a system including an equalizer, according to example embodiments of the inventive concepts.

FIG. 10 is a diagram illustrating a system including an equalizer, according to example embodiments of the inventive concepts.

Referring to FIG. 10, a memory device 1100 and a host device 1200 may communicate with each other through an interface 1300, and the memory device 1100 may include a controller 1110 and/or a memory 1120.

The interface 1300 may use an electrical signal and/or an optical signal and may be implemented by, as a non-limiting example, a serial advanced technology attachment (SATA) interface, a SATA express (SATAe) interface, a serial attached small computer system interface (serial attached SCSI: SAS), a Universal Serial Bus (USB) interface, or a combination thereof. The interface 1300 may include at least one of the reception equalizer 211 of FIG. 2, the equalizer 211A of FIG. 3, and the summing circuit including the current summing circuit 10 of FIG. 4. Accordingly, operations of the interface 1300 may be stable, and the performance of the interface 1300 may be improved.

In example embodiments, the memory device 1100 may communicate with the host device 1200 by being removably coupled to the host device 1200. The memory 1120 may be non-volatile memory, and the memory device 1100 may be referred to as a storage system. For example, the memory device 1100 may be implemented by, as a non-limiting example, a solid-state drive or solid-state disk (SSD), an embedded SSD (eSSD), a multimedia card (MMC), an embedded multimedia card (eMMC), or the like. The controller 1110 may control the memory 1120 in response to a request received from the host device 1200 through the interface 1300.

Figure 11:
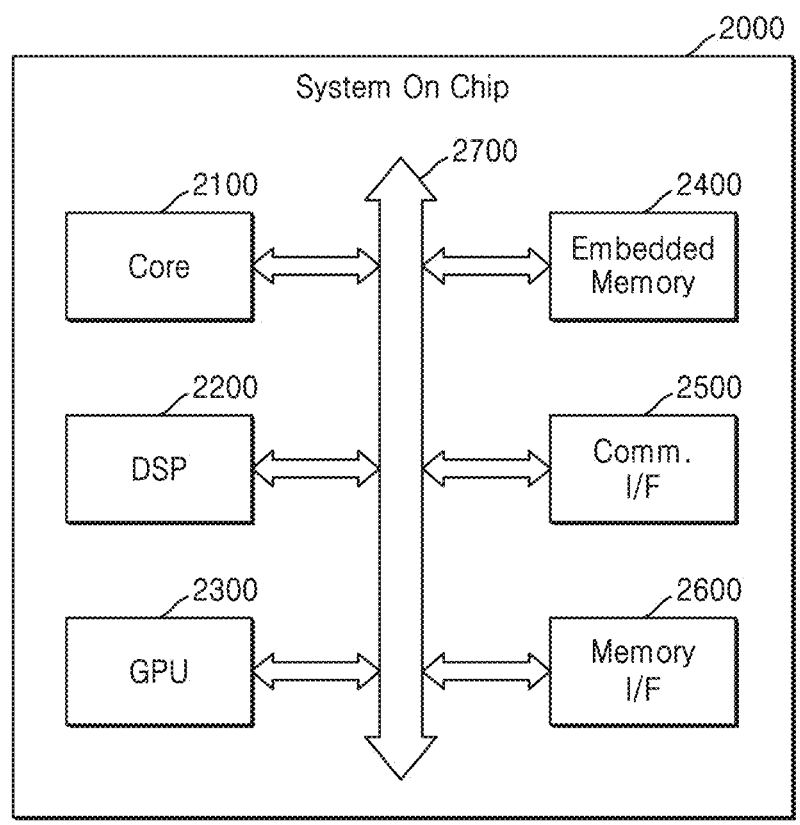
FIG. 11 is a diagram illustrating a system-on-chip including an equalizer, according to example embodiments of the inventive concepts.

FIG. 11 is a diagram illustrating a system-on-chip including an equalizer, according to example embodiments of the inventive concepts.

Referring to FIG. 11, a system-on-chip (SoC) 2000 may refer to an integrated circuit in which components of a computing system or another electronic system are integrated. For example, an application processor (AP) as one of SoCs 2000 may include a processor and components for other functions. As shown in FIG. 11, the SoC 2000 may include a core 2100, a digital signal processor (DSP) 2200, a graphics processing unit (GPU) 2300, embedded memory 2400, a communication interface 2500, and/or a memory interface 2600. The components of the SoC 2000 may communicate with each other through a bus 2700.

The core 2100 may process instructions and may control operations of the components included in the SoC 2000. For example, the core 2100 may drive an operating system and execute applications on the operating system, by processing a series of instructions. The DSP 2200 may generate useful data by processing a digital signal, for example, a digital signal provided from the communication interface 2500. The GPU 2300 may generate data for an image, which is output through a display device, from image data provided from the embedded memory 2400 or the memory interface 2600, and may encode the image data. The embedded memory 2400 may store data required for the core 2100, the DSP 2200, and the GPU 2300 to operate. The memory interface 2600 may provide an interface for external memory of the SoC 2000, for example, dynamic random access memory (DRAM), flash memory, or the like.

The communication interface 2500 may provide serial communication with the outside of the SoC 2000. For example, the communication interface 2500 may be connected to an Ethernet network. The communication interface 2500 may include at least one of the reception equalizer 211 of FIG. 2, the equalizer 211A of FIG. 3, and the summing circuit including the current summing circuit 10 of FIG. 4. Accordingly, operations of the communication interface 2500 may be stable, and the performance of the communication interface 2500 may be improved.

In some example embodiments, some or all of the apparatuses, systems, electronic devices and/or elements thereof as described herein with reference to any of the drawings and/or any portions thereof (including without limitation any blocks, modules, processors, cameras, or the like) may include, may be included in, and/or may be implemented by one or more instances of processors such as hardware including logic circuits; a hardware/software combination such as a processor executing software; or a combination thereof. For example, a processor as described herein more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, a processor may include a non-transitory computer readable storage device, for example a solid state drive (SSD), storing a program of instructions, and an instance of processor hardware, for example a CPU, configured to execute the program of instructions to implement the functionality and/or methods performed by some or all of any apparatus, system, and/or element according to any of the example embodiments (including without limitation any portion, block, module, processor, camera, or the like of any apparatus, system, and/or element according to any of the example embodiments), including for example any of methods according to any of the example embodiments.

While the inventive concepts have been particularly shown and described with reference to example embodiments thereof, it will be understood that various changes in form and details may be made therein without departing from the spirit and scope of the following claims.

What is claimed is:

1. An equalizer comprising a summing circuit,
   wherein the summing circuit comprises:
   a reference signal generator configured to generate a first reference signal and a second reference signal, based on a coefficient code;
   a first non-overlap clock buffer configured to generate a first switching signal and a second switching signal by using the first reference signal; and
   a first current source configured to receive the first switching signal and the second switching signal generated by the first non-overlap clock buffer, generate a first output current by using a bias voltage, and output the first output current to an output line,
   wherein the first switching signal comprises a switching signal and a complementary switching signal that is a complementary signal to the switching signal, and
   wherein a logic low period of the second switching signal is comprised in a logic high period of the complementary switching signal of the first switching signal.

2. The equalizer of claim 1, wherein the equalizer is a decision feedback equalizer (DFE).

3. The equalizer of claim 1, wherein the summing circuit further comprises:
   a second non-overlap clock buffer configured to generate a first switching signal and a second switching signal by using the second reference signal; and
   a second current source configured to receive the first switching signal and the second switching signal generated by the second non-overlap clock buffer, generate a second output current by using the bias voltage, and output the second output current to the output line.

4. The equalizer of claim 3, wherein the first current source comprises:
   a first switch configured to be switched according to the first switching signal;
   a second switch configured to be switched according to the second switching signal; and
   a current cell configured to generate the first output current according to the bias voltage.

5. The equalizer of claim 4, wherein the first switch comprises a transmission gate,
   the second switch comprises a P-type transistor connected between a power supply voltage terminal and a first node, and
   the current cell comprises a P-type transistor configured to generate the output current according to a voltage of the first node.

6. The equalizer of claim 1, wherein the first non-overlap clock buffer comprises a first circuit configured to generate the first switching signal and a second circuit configured to generate the second switching signal, and
   each of the first circuit and the second circuit comprises a NAND gate and a plurality of inverters.

7. The equalizer of claim 6, wherein the NAND gate of the first circuit receives the first reference signal and the second switching signal, and
   the NAND gate of the second circuit receives a signal, into which the first reference signal is inverted, and the complementary switching signal.

8. The equalizer of claim 1, further comprising:
   a first latch circuit, wherein the first latch circuit and the summing circuit form an even data path configured to receive a reception data signal; and a second latch circuit, wherein the second latch circuit and the summing circuit form an odd data path configured to receive the reception data signal, wherein an even data signal output from the first latch circuit is input to the summing circuit comprised in the odd data path, and an odd data signal output from the second latch circuit is input to the summing circuit comprised in the even data path.

9. An equalizer comprising a summing circuit, wherein the summing circuit comprises:
 a reference signal generator configured to generate a reference signal, based on a coefficient code;
 a non-overlap clock buffer configured to generate a first switching signal and a second switching signal by using the reference signal; and
 a current source comprising a first switch configured to be switched by the first switching signal, a second switch configured to be switched by the second switching signal, and a current cell configured to generate an output current, and
 wherein at least one of the first switch and the second switch is in an off-state.

10. The equalizer of claim 9, wherein the first switch comprises a transmission gate,
 the second switch comprises a P-type transistor connected between a power supply voltage terminal and a first node, and
 the current cell comprises a P-type transistor configured to generate the output current according to a voltage of the first node.

11. The equalizer of claim 9, wherein the first switching signal comprises a switching signal and a complementary switching signal that is a complementary signal to the switching signal.

12. The equalizer of claim 11, wherein a logic low period of the second switching signal is comprised in a logic low period of the switching signal of the first switching signal.

13. The equalizer of claim 11, wherein a logic high period of the switching signal of the first switching signal is comprised in a logic high period of the second switching signal.

14. The equalizer of claim 11, wherein a logic low period of the second switching signal is comprised in a logic high period of the complementary switching signal of the first switching signal.

15. The equalizer of claim 11, wherein a logic low period of the complementary switching signal of the first switching signal is comprised in a logic high period of the second switching signal.

16. The equalizer of claim 9, wherein the non-overlap clock buffer comprises a first circuit configured to generate the first switching signal and a second circuit configured to generate the second switching signal, and
 each of the first circuit and the second circuit comprises a NAND gate and a plurality of inverters.

17. A summing circuit comprising a current summing circuit,
 wherein the current summing circuit comprises:
 a reference signal generator configured to generate a plurality of reference signals, based on a coefficient code;
 a plurality of non-overlap clock buffers configured to generate a plurality of first switching signals and a plurality of second switching signals by using the plurality of reference signals, respectively; and
 a plurality of current sources, each comprising a first switch, a second switch, and a current cell, and
 wherein at least one of the first switch and the second switch of each of the plurality of current sources is in an off-state.

18. The summing circuit of claim 17, wherein the first switch comprises a transmission gate,
 the second switch comprises a P-type transistor connected between a power supply voltage terminal and a first node, and
 the current cell comprises a P-type transistor configured to generate an output current according to a voltage of the first node.

19. The summing circuit of claim 17, wherein the first switching signal comprises a switching signal and a complementary switching signal that is a complementary signal to the switching signal, and
 after a level of the switching signal of the first switching signal is changed from logic high to logic low, by changing a level of the second switching signal from logic high to logic low, the first switch is turned off, and then, the second switch is turned on.

20. The summing circuit of claim 17, wherein the first switching signal comprises a switching signal and a complementary switching signal that is a complementary signal to the switching signal, and
 after a level of the second switching signal is changed from logic low to logic high, by changing a level of the switching signal of the first switching signal from logic low to logic high, the second switch is turned off, and then, the first switch is turned on.

\* \* \* \* \*